(12) United States Patent
Chen et al.

(10) Patent No.: US 7,737,790 B1
(45) Date of Patent: Jun. 15, 2010

(54) CASCODE AMPLIFIER AND METHOD FOR CONTROLLING CURRENT OF CASCODE AMPLIFIER

(75) Inventors: Yen-Horng Chen, Taipei (TW); Yu-Hsin Lin, Taipei (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/421,615

(22) Filed: Apr. 9, 2009

(51) Int. Cl.
*H03F 3/04* (2006.01)
(52) U.S. Cl. .................. 330/311; 330/296; 330/253
(58) Field of Classification Search .......... 330/311, 330/296, 253
See application file for complete search history.

(56) References Cited

U.S. PATENT DOCUMENTS

| 4,663,599 A * | 5/1987 | Patch .................. 330/311 |
| 6,778,016 B2 | 8/2004 | Luo |
| 7,088,187 B1 * | 8/2006 | Jin et al. .................. 330/311 |
| 7,397,309 B2 * | 7/2008 | Tanoi .................. 330/296 |
| 7,414,481 B2 * | 8/2008 | Li et al. .................. 330/311 |
| 7,489,202 B1 * | 2/2009 | Griffiths et al. .......... 330/311 |

OTHER PUBLICATIONS

Mikael Cimino, Herve Lapuyade, Yann Deval, Thierry Taris, and Jean-Baptiste Begueret, "Design of a 0.9 V 2.45 GHz Self-Testable and Reliability-Enhanced CMOS LNA", May 2008, pp. 1187-1194, IEEE Journal of Solid-State Circuits, vol. 43, No. 5.

* cited by examiner

*Primary Examiner*—Patricia Nguyen
(74) *Attorney, Agent, or Firm*—Winston Hsu

(57) ABSTRACT

A cascode amplifier includes a first transistor, a second transistor, a third transistor, a fourth transistor and a bias circuit. Each of the transistors has a gate electrode, a first electrode and a second electrode, a first electrode of the first transistor is coupled to a second electrode of the second transistor, a first electrode of the third transistor is coupled to a second electrode of the fourth transistor, and gate electrodes of the third and the fourth transistors are coupled to gate electrodes of the first and the second transistors, respectively. The bias circuit is coupled to the first electrode of the fourth transistor, and is used for biasing a voltage level at the first electrode of the fourth transistor to make the second and the fourth transistors operate in a same region.

12 Claims, 5 Drawing Sheets

Provide the transistors M1 and M2, where each of the transistors M1 and M2 has a gate electrode, a first electrode and a second electrode, the first electrode of the transistor M1 is coupled to the second electrode of the transistor M2, the gate electrode of the transistor M1 is coupled to the input signal terminal, and the first electrode of the transistor M2 is coupled to the output signal terminal ~500

Provide the transistors M3 and M4, where each of the transistors M3 and M4 has a gate electrode, a first electrode and a second electrode, the first electrode of the transistor M3 is coupled to the second electrode of the transistor M4, and the gate electrodes of the transistors M3 and M4 are coupled to the gate electrodes of the transistors M1 and M2, respectively ~502

Bias a voltage level at the first electrode of the transistor M4 to make the transistors M2 and M4 operate in a same region ~504

CASCODE AMPLIFIER AND METHOD FOR CONTROLLING CURRENT OF CASCODE AMPLIFIER

BACKGROUND

The present invention relates to a cascode amplifier, and more particularly, to a cascaded amplifier and method for controlling a current of the cascode amplifier.

FIG. 1 is a diagram illustrating a conventional cascode current mirror 100. The cascode current mirror 100 includes four transistors M1-M4 and a current source $I_1$. The function of the cascode current mirror 100 is to make the transistors M1 and M2 replicate (or mirror) currents flowing through the transistors M3 and M4 (i.e., current provided by the current source $I_1$). However, in the cascode current mirror 100, the transistors M2 and M4 may not be operated in the same region: for example, the transistor M2 is in a saturation region of operation while the transistor M4 is in a triode region of operation. As a result, voltage levels of nodes N2 and N4 may not be close to each other, and a voltage level of a node N1 thus could not track to a voltage level of a node N3, causing the currents of the transistors M1 and M2 to not well correspondingly mirror the current provided by the current source $I_1$.

In addition, short channel devices, of which the channel has the minimum length in its design rule, are typically chosen in order to achieve good amplifier performance, such as gain and noise figure (NF). However, a transistor with a shorter channel length is more likely to suffer from the well-known channel-length modulation effect. FIG. 2 shows an $I_d$-$V_{DS}$ characteristic of the transistor, where $I_d$ is a current of the transistor and $V_{DS}$ is a voltage difference between drain and source electrodes of the transistor. With a serious channel-length modulation effect, $I_d$ rapidly increases with $V_{DS}$ (i.e., a slope of a curve 210 is great when the transistor operates in the saturation region). Therefore, in deep sub-micro process, even when both the transistors M4 and M2 operate in the saturation region, it is hard to keep a stable current mirror ratio because of the short channel length. That is, currents of the transistors M1 and M3 may not meet the request due to the disparity between the voltages of the nodes N2 and N4 shown in FIG. 1.

SUMMARY

It is therefore an objective of the present invention to provide a cascode amplifier and a method for controlling a current of the cascode amplifier, in order to solve the above-mentioned problems.

According to one embodiment of the present invention, a cascode amplifier comprises a first transistor, a second transistor, a third transistor, a fourth transistor and a bias circuit. Each of the transistors has a gate electrode, a first electrode and a second electrode. A first electrode of the first transistor is coupled to a second electrode of the second transistor, a first electrode of the third transistor is coupled to a second electrode of the fourth transistor, and gate electrodes of the third and the fourth transistors are coupled to gate electrodes of the first and the second transistors, respectively. The bias circuit is coupled to the first electrode of the fourth transistor, and is used for biasing a voltage level at the first electrode of the fourth transistor to make the second and the fourth transistors operate in a same region.

According to another embodiment of the present invention, a method for controlling a current of a cascode amplifier comprises: providing a first transistor and a second transistor, wherein each of the first and the second transistors has a gate electrode, a first electrode and a second electrode. The first electrode of the first transistor is coupled to the second electrode of the second transistor, the gate electrode of the first transistor is coupled to an input signal terminal of the cascode amplifier, and the first electrode of the second transistor is coupled to an output signal terminal of the cascode amplifier. The method further comprises: providing a third transistor and a fourth transistor, wherein each of the third and the fourth transistors has a gate electrode, a first electrode and a second electrode. The first electrode of the third transistor is coupled to the second electrode of the fourth transistor, and the gate electrodes of the third and the fourth transistors are coupled to the gate electrodes of the first and the second transistors, respectively. A voltage level at the first electrode of the fourth transistor is biased to make the second and the fourth transistors operate in a same region.

According to the cascode amplifier and the method for controlling the current of the cascode amplifier, the voltage level at the first electrode of the fourth transistor is biased to be substantially equal to the voltage level at the first electrode of the second transistor, and therefore a current of the first and the second transistors is much closer to a current of the third and the fourth transistors.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 is a flowchart of controlling a current of a cascode amplifier according to one embodiment of the present invention.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
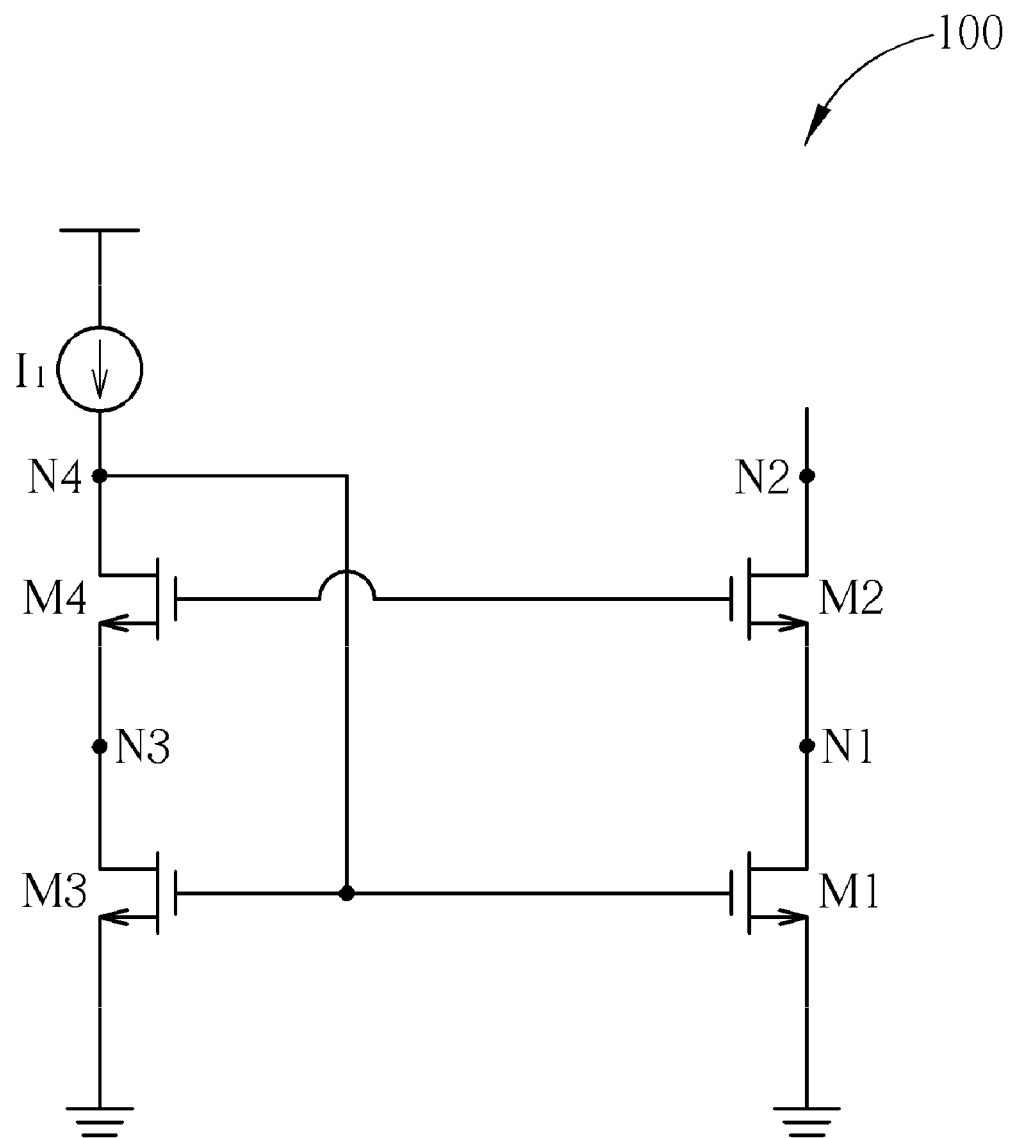
FIG. 1 is a diagram illustrating a conventional cascode current mirror.
Figure 2:
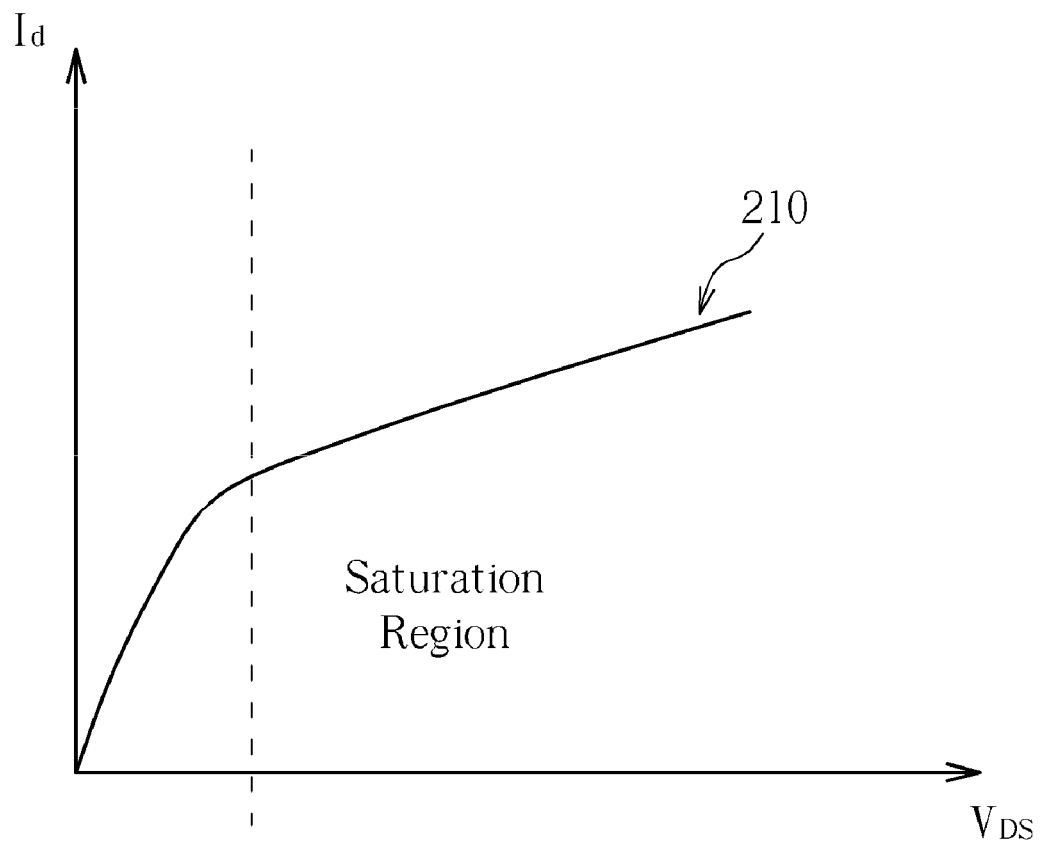
FIG. 2 is a diagram illustrating Id-VDS characteristics of the transistor.
Figure 3:
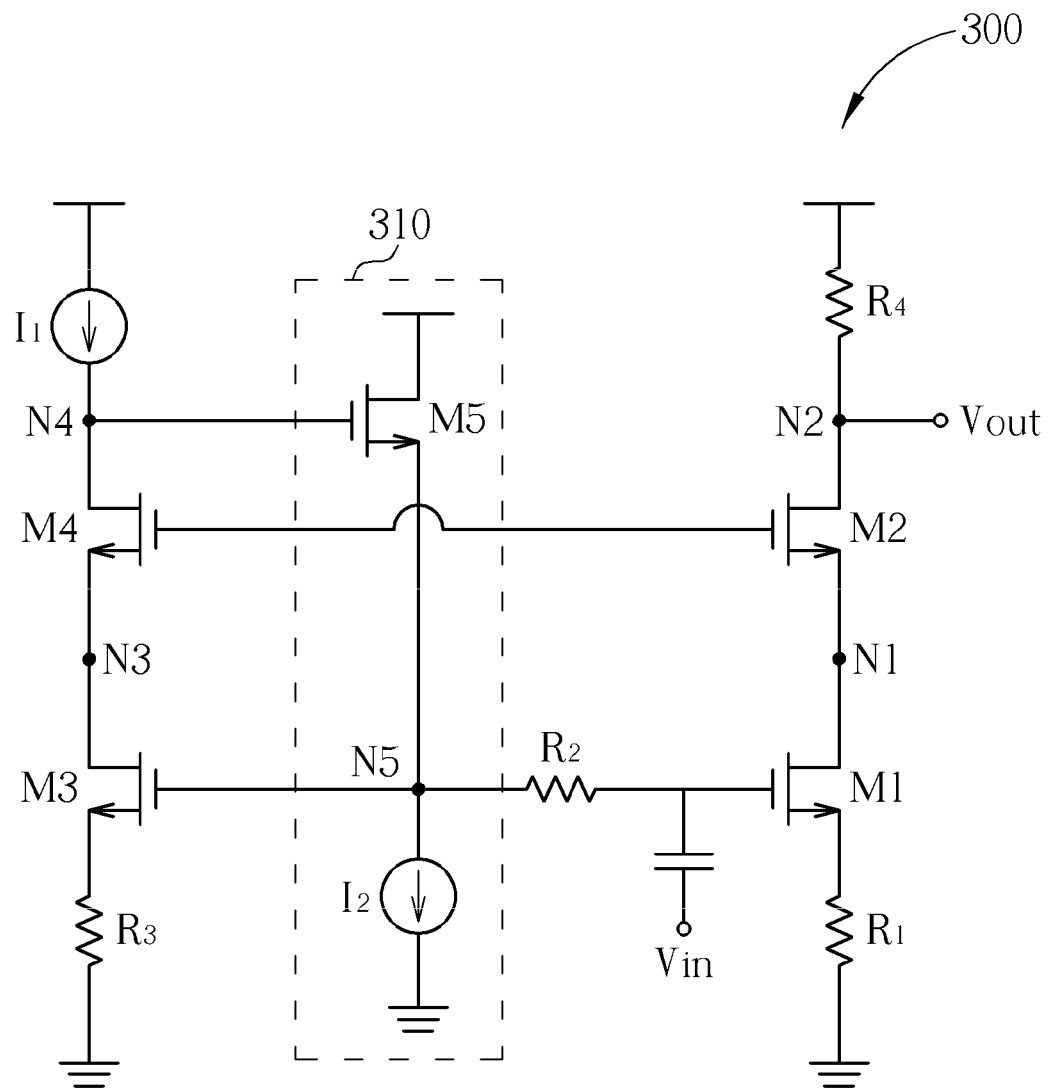
FIG. 3 is a diagram illustrating a cascode amplifier according to one embodiment of the present invention.

FIG. 3 is a diagram illustrating a cascode amplifier 300 according to one embodiment of the present invention. The cascode amplifier 300 includes four metal-oxide semiconductor (MOS) transistors M1-M4, four resistors $R_1$-$R_4$, a current source $I_1$, and a bias circuit 310, where the bias circuit 310 includes a MOS transistor M5 and a current source $I_2$. The transistors M1 and M2 are coupled in cascode (i.e., a drain electrode of the transistor M1 is coupled to a source electrode of the transistor M2 at a node N1), the transistors M3 and M4 are coupled in cascode (i.e., a drain electrode of the transistor M3 is coupled to a source electrode of the transistor M4 at a node N3), and gate electrodes of the transistors M3 and M4 are coupled to gate electrodes of the transistors M1 and M2, respectively. In addition, the gate electrode of the transistor M1 is coupled to an input signal terminal of the cascode amplifier 300, and a drain electrode (i.e., a node N2) of the transistor M2 is coupled to an output signal terminal of the cascode amplifier 300.

It is noted that, in the cascode amplifier 300 shown in FIG. 3, the drain electrode of the transistor M1 is directly connected to the source electrode of the transistor M2, and the drain electrode of the transistor M3 is directly connected to the source electrode of the transistor M4. In other embodiments of the present invention, the drain electrode of the transistor M1 can be coupled to the source electrode of the transistor M2 via another component such as a resistor, and the drain electrode of the transistor M3 can also be coupled to the source electrode of the transistor M4 via another component such as a resistor. These alternative designs shall all fall in the scope of the present invention.

The cascode amplifier 300 is used to amplify an input signal Vin inputted to the input signal terminal and output an output signal Vout from the output signal terminal. The transistors M1 and M2 replicate (or mirror) a current flowing through the transistors M3 and M4: that is, a current flowing through the transistors M1 and M2 would substantially equal to or duplicate a certain times of the current flowing through the transistors M3 and M4 (i.e., the current provided by the current source H. Therefore, in the cascode amplifier 300, the bias circuit 310 is provided to bias a voltage level at a drain electrode (a node N4) of the transistor M4, in order to make the voltage level at the drain electrode of the transistor M4 be substantially close to or even equal to a voltage level at the drain electrode of the transistor M2 (i.e., the voltage levels at nodes N2 and N4 are substantially equal). When the voltage levels at nodes N2 and N4 are substantially close to or even equal, the currents of the transistors M1 and M2 will precisely mirror the current flowing through the transistors M3 and M4.

In the bias circuit 310, a gate electrode of the transistor M5 is coupled to a drain electrode of the transistor M4 (i.e., the node N4), a source electrode of the transistor M5 is coupled to the gate electrode of the transistor M3 (i.e., a node N5), and the current source $I_2$ provides a predetermined current to the transistor M5. In the operations of the bias circuit 310, because of the predetermined current flowing through the transistor M5 and a fixed voltage level at the node N5, the voltage level at the node N4 will be biased at a fixed voltage level, such as the designed voltage level at the node N2. Therefore, the currents of the transistors M1 and M2 can precisely mirror the current flowing through the transistors M3 and M4.

The transistors M2 and M4 generally operate in the saturation region. In another embodiment of the present invention, however, the transistors M2 and M4 can also be operated in the triode region. As long as the voltage levels at the node N2 and N4 are substantially equal and the current flowing through the transistors M1 and M2 can precisely mirror the current flowing through the transistors M3 and M4, these alternative designs shall all fall within the scope of the present invention.

It is noted that, in the cascode amplifier 300, all the transistors M1-M5 are MOS transistors. In another embodiment of the present invention, however, the cascode amplifier 300 can be implemented by bi-polar junction transistors (BJTs) (i.e., the MOS transistors M1-M5 are replaced by BJTs). A person skilled in this art should understand how to utilize the BJTs to implement the cascode amplifier in such design after reading the above description regarding the cascode amplifier 300, therefore further descriptions are omitted here.

Figure 4:
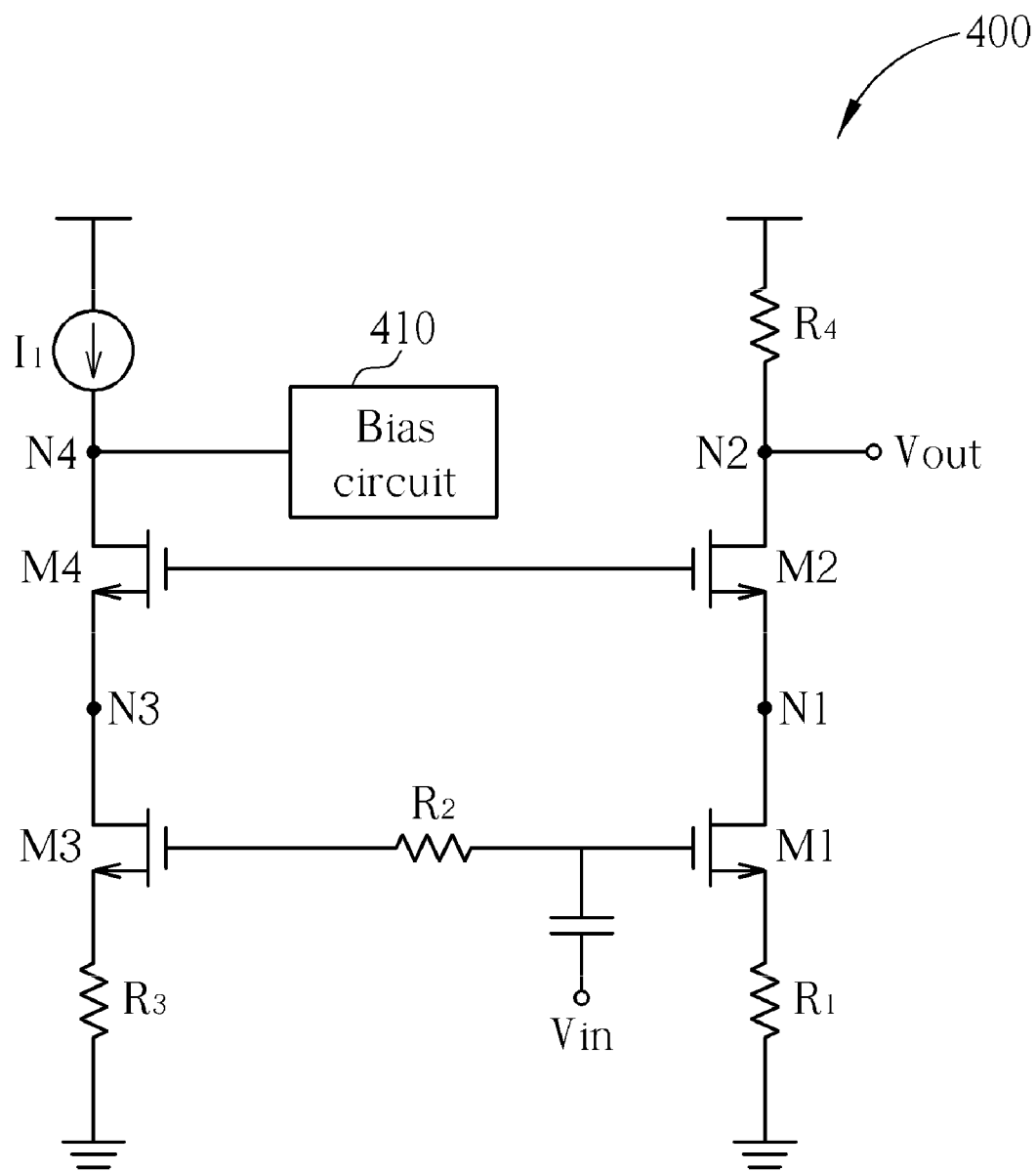
FIG. 4 is a generalized architecture of an exemplary cascode amplifier of one embodiment of the present invention.

The bias circuit 310 of the cascode amplifier 300 shown in FIG. 3 is merely an embodiment of the present invention. As long as the voltage level at the node N4 is substantially equal to the voltage level at the node N2, the bias circuit 310 can be implemented in another available circuit design. FIG. 4 is a generalized architecture of an exemplary cascode amplifier 400 of the present invention. The cascode amplifier 400 includes four transistors M1-M4, four resistors $R_1$-$R_4$, a current source $I_1$, and a bias circuit 410. The bias circuit 410 is used to bias the voltage level at the node N4 to make the voltage levels at the nodes N2 and N4 substantially equal, so the current flowing through the transistors M1 and M2 can precisely mirror the current flowing through the transistors M3 and M4. The architecture of the cascode amplifier 400 is largely similar to the cascode amplifier 300 shown in FIG. 3, therefore further descriptions are omitted here.

Similarly, in the cascode amplifier 400 shown in FIG. 4, the drain electrode of the transistor M1 is directly connected to the source electrode of the transistor M2, and the drain electrode of the transistor M3 is directly connected to a source electrode of the transistor M4. In other embodiments of the present invention, the drain electrode of the transistor M1 can be coupled to the source electrode of the transistor M2 via another component such as a resistor, and the drain electrode of the transistor M3 can also be coupled to the source electrode of the transistor M4 via another component such as a resistor. These alternative designs shall all fall in the scope of the present invention.

Please refer to FIG. 5. FIG. 5 is a flowchart of controlling a current of a cascode amplifier according to one embodiment of the present invention. Referring to the cascode amplifier 400 shown in FIG. 4 and the flowchart shown in FIG. 5, the method for controlling the current of the cascode amplifier 400 are as follows:

Step 500: provide the transistors M1 and M2, where each of the transistors M1 and M2 has a gate electrode, a first electrode and a second electrode, the first electrode of the transistor M1 is coupled to the second electrode of the transistor M2, the gate electrode of the transistor M1 is coupled to the input signal terminal, and the first electrode of the transistor M2 is coupled to the output signal terminal.

Step 502: provide the transistors M3 and M4, where each of the transistors M3 and M4 has a gate electrode, a first electrode and a second electrode, the first electrode of the transistor M3 is coupled to the second electrode of the transistor M4, and the gate electrodes of the transistors M3 and M4 are coupled to the gate electrodes of the transistors M1 and M2, respectively.

Step 504: bias a voltage level at the first electrode of the transistor M4 to make the transistors M2 and M4 operate in a same region.

Briefly summarized, the cascode amplifier of the embodiments includes a bias circuit for making the voltage levels at the nodes N2 and N4 substantially equal. Therefore, even in deep sub-micro processes where a size of the transistor is smaller and a channel length of the transistor is shorter, the current flowing through the transistors is less affected by the channel-length modulation effect, and can also be precisely mirrored.

Those skilled in the art will readily observe that numerous modifications and alterations of the device and method may be made while retaining the teachings of the invention.

What is claimed is:

1. A cascode amplifier, comprising:
   an input signal terminal;
   an output signal terminal;
   a first transistor and a second transistor, wherein each of the first and the second transistors has a gate electrode, a first electrode and a second electrode, the first electrode of the first transistor is coupled to the second electrode of the second transistor, the gate electrode of the first transistor is coupled to the input signal terminal, and the first electrode of the second transistor is coupled to the output signal terminal;
   a third transistor and a fourth transistor, wherein each of the third and the fourth transistors has a gate electrode, a first electrode and a second electrode, the first electrode of the third transistor is coupled to the second electrode of the fourth transistor, and the gate electrodes of the third and the fourth transistors are coupled to the gate electrodes of the first and the second transistors, respectively; and
   a bias circuit, coupled to the first electrode of the fourth transistor, for biasing a voltage level at the first electrode of the fourth transistor to make the second and the fourth transistors operate in a same region.

2. The cascode amplifier of claim 1, wherein the bias circuit is arranged to make the voltage level at the first electrode of the fourth transistor substantially equal a voltage level at the first electrode of the second transistor.

3. The cascode amplifier of claim 1, wherein the first, second, third and fourth transistors are metal-oxide semiconductor (MOS) transistors, and the bias circuit is arranged to make the second and the fourth transistors operate in a saturation region.

4. The cascode amplifier of claim 3, wherein the bias circuit is arranged to make the voltage level at the first electrode of the fourth transistor substantially equal a voltage level at the first electrode of the second transistor.

5. The cascode amplifier of claim 1, wherein the bias circuit comprises:
   a fifth transistor, wherein a gate electrode of the fifth transistor is coupled to the first electrode of the fourth transistor; and
   a current source, coupled to the fifth transistor, for providing a predetermined current to the fifth transistor.

6. The cascode amplifier of claim 5, wherein the gate electrode of the third transistor is coupled between the fifth transistor and the current source; and
   the gate electrodes of the first and third transistors are coupled to each other through a resistor coupled.

7. A method for controlling a current of a cascode amplifier, comprising:
   providing a first transistor and a second transistor, wherein each of the first and the second transistors has a gate electrode, a first electrode and a second electrode, the first electrode of the first transistor is coupled to the second electrode of the second transistor, the gate electrode of the first transistor is coupled to an input signal terminal, and the first electrode of the second transistor is coupled to an output signal terminal;
   providing a third transistor and a fourth transistor, wherein each of the third and the fourth transistors has a gate electrode, a first electrode and a second electrode, the first electrode of the third transistor is coupled to the second electrode of the fourth transistor, and the gate electrodes of the third and the fourth transistors are coupled to the gate electrodes of the first and the second transistors, respectively; and
   biasing a voltage level at the first electrode of the fourth transistor to make the second and the fourth transistors operate in a same region.

8. The method of claim 7, wherein the step of biasing the voltage level at the first electrode of the fourth transistor to make the second and the fourth transistors operate in the same region comprises:
   biasing the voltage level at the first electrode of the fourth transistor to make the voltage level at the first electrode of the fourth transistor substantially equal a voltage level at the first electrode of the second transistor.

9. The method of claim 7, wherein the first, second, third and fourth transistors are metal-oxide semiconductor (MOS) transistors, and the step of biasing the voltage level at the first electrode of the fourth transistor to make the second and the fourth transistors operate in the same region comprises:
   biasing the voltage level at the first electrode of the fourth transistor to make the second and the fourth transistors operate in a saturation region.

10. The method of claim 9, wherein the step of biasing the voltage level at the first electrode of the fourth transistor to make the second and the fourth transistors operate in the same region comprises:
    biasing the voltage level at the first electrode of the fourth transistor to make the voltage level at the first electrode of the fourth transistor substantially equal a voltage level at the first electrode of the second transistor.

11. The method of claim 7, wherein the step of biasing the voltage level at the first electrode of the fourth transistor to make the second and the fourth transistors operate in the same region comprises:
    providing a fifth transistor, wherein a gate electrode of the fifth transistor is coupled to the first electrode of the fourth transistor; and
    providing a current source, wherein the current source provides a predetermined current to the fifth transistor.

12. The method of claim 11, wherein the gate electrode of the third transistor is coupled between the fifth transistor and the current source; and the gate electrodes of the first and third transistors are coupled to each other through a resistor coupled.

* * * * *